(12) United States Patent
Nadkarni et al.

(10) Patent No.: US 8,873,269 B2
(45) Date of Patent: Oct. 28, 2014

(54) READ ONLY MEMORY BITLINE LOAD-BALANCING

(71) Applicant: International Business Machines Corporation, Armonk, NY (US)

(72) Inventors: Rahul K. Nadkarni, Greenvalle, NC (US); Daniel R. Baratta, Durha, NC (US); Konark Patel, Cary, NC (US); Hoan H. Nguyen, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 13/845,228

(22) Filed: Mar. 18, 2013

(65) Prior Publication Data

US 2014/0268985 A1     Sep. 18, 2014

(51) Int. Cl.
```
G11C 17/00    (2006.01)
G11C 17/08    (2006.01)
G06F 17/50    (2006.01)
G11C 5/02     (2006.01)
G11C 17/12    (2006.01)
```
(52) U.S. Cl.
CPC ............ *G11C 17/08* (2013.01); *G06F 17/5077* (2013.01); *G11C 5/025* (2013.01); *G11C 17/12* (2013.01); *G11C 17/126* (2013.01)
USPC .......................... 365/104; 365/94; 365/185.16

(58) Field of Classification Search
CPC ...... G11C 5/025; G11C 17/12; G11C 17/126; G11C 16/0491; G11C 11/5629
USPC .................................. 365/51, 94, 104, 185.16
See application file for complete search history.

(56) References Cited

U.S. PATENT DOCUMENTS

| | | | |
|---|---|---|---|
| 5,917,224 A | 6/1999 | Zangara | |
| 7,961,490 B2 * | 6/2011 | Nevers et al. | 365/51 |
| 8,422,262 B2 * | 4/2013 | Nevers et al. | 365/51 |
| 8,711,625 B2 * | 4/2014 | Li et al. | 365/185.09 |
| 2010/0177544 A1 | 7/2010 | Nevers et al. | |
| 2011/0249481 A1 | 10/2011 | Nevers et al. | |

\* cited by examiner

*Primary Examiner* — Gene Auduong
(74) *Attorney, Agent, or Firm* — Scully, Scott, Murphy & Presser, P.C.; H. Daniel Schnurmann (57) ABSTRACT

A Read Only Memory (ROM) bitline cell apparatus and programming method therefore. The programming methodology ensures a ROM structure having open state and/or breaks in the diffusion and/or dummy wordline rows to provide bitline load balancing. The ROM bitline cell apparatus and programming method exhibits improved load balancing for any combination of 1's or all 0's on the bitline. The programming methodology identifies groups of consecutive '1's on the bitline and instead of connecting the '1' devices between BL/BL or GND/GND, those '1' devices can be connected between BL/OPEN, OPEN/BL, GND/OPEN, OPEN/GND or OPEN/OPEN. With little or no variation in bitline loading, timing can be optimized for that single case of bitline loading.

26 Claims, 9 Drawing Sheets

READ ONLY MEMORY BITLINE LOAD-BALANCING

FIELD OF THE INVENTION

The present disclosure generally relates to read-only memory (ROM) devices, systems and structures, and more particularly, a novel ROM structure and design methodology that improves bitline load balancing.

BACKGROUND

Figure 1:
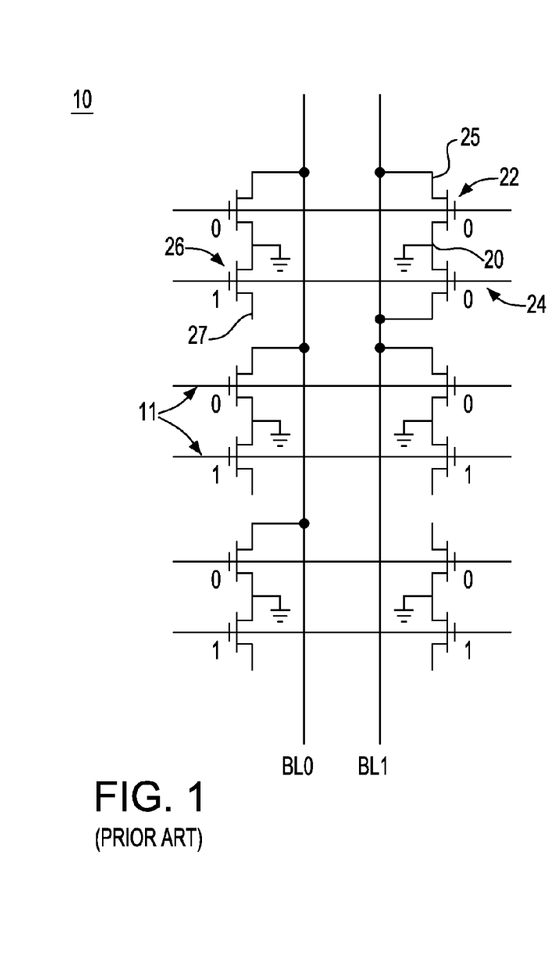
FIG. 1 depicts a conventional read-only memory (ROM) 10.

A read-only memory (ROM) structure such as ROM 10 is shown in FIG. 1, where a set of rows or wordlines 11 cross columns or bitlines, e.g., two bitlines shown BL0, BL1. As shown in FIG. 1, in a typical ROM, an activation cell, typically comprising a transistor such as a MOSFET or similar semiconductor device 22, is triggered by a wordline signal to provide a stored bit value, e.g., logic level '1' or logic level '0', at the bitline. As shown in FIG. 1, two adjacent activation cells e.g., activation transistors 22, 24 that connect bitline BL1, share a common node, e.g., source node 20, which is connected to ground (GND). In this structure, cell programming is done by connecting or disconnecting the drain node from the bitline. To program an activation cell to '0', the drain (or source) terminal 25 of transistor 22 is connected to the bitline, e.g., by a via or some other conductive connection. To program an activation cell to '1', the drain (or source) is disconnected from the bitline such as terminal 27 of transistor 26. Bitlines are typically pre-charged to VDD, which can provide a logic level '1' signal at bitline BL0 when transistor 26 is activated. During a read operation, one of the wordlines turns ON and bitline pre-charge is turned OFF. A corresponding cell programmed to '0' will discharge the bitline. On the other hand, if the corresponding cell is programmed to '1', it will not affect the bitline and the bitline will continue to stay at its pre-charged value. Alternatively the bitline could be pre-discharged to ground and the shared node between two adjacent activation cells could be a power supply voltage, e.g., referred to as "VDD". In that configuration, to program an activation cell to '1', the drain (or source) terminal is connected to the bitline and to program an activation cell to '0', the drain (or source) is disconnected from the bitline. During a read operation in this configuration, one of the wordlines turns ON and the bitline pre-discharge is turned OFF. A cell programmed to '1' will charge up the bitline. On the other hand, if a cell is programmed to '0', it will not affect the bitline and the bitline will continue to stay at its pre-discharged value.

In the conventional ROM structure 10 of FIG. 1, loading on the bitline is greatly dependent upon the number of '1's and '0's on that bitline. For example if a bitline has 128 cells and all cells on that bitline are programmed to '0', that bitline will have 128 bitline connections and the associated diffusion load. On the other hand if a 128-bit bitline has 127 '1's and one '0', that bitline will have only one bitline connection and will discharge significantly faster when reading that '0' than the bitline that has 128 '0's. The bitline loading and correspondingly the bitline discharge time will greatly vary depending upon the number of '1's and '0's (physical connections) on that bitline. Lightly loaded bitlines are more susceptible to noise than heavily loaded bitlines. This variation in the bitline loading can drive significant complexity in timing and adversely affect performance and power. There is a definite need to minimize the bitline load variation across all bitlines.

Figure 2A:
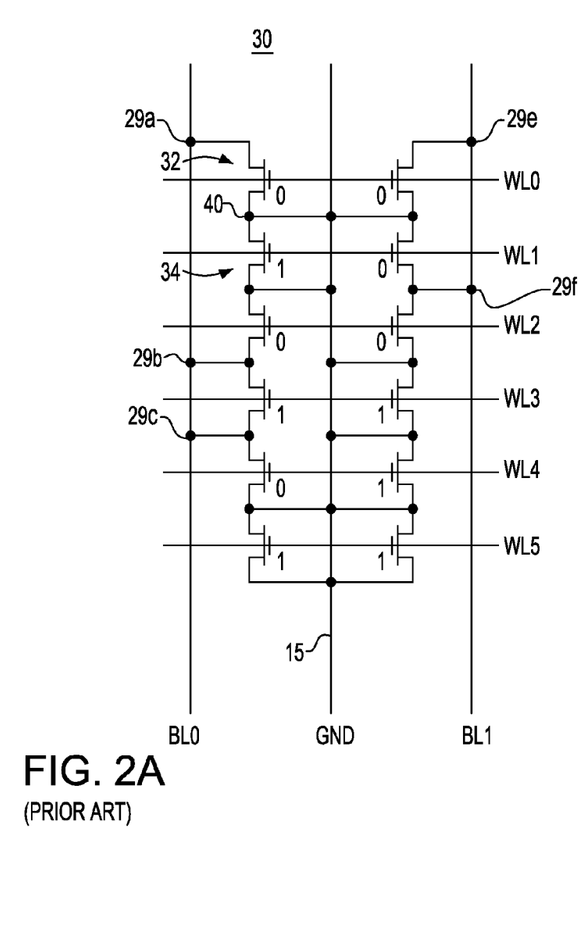
FIGS. 2A and 2B depict respective embodiments of identically programmed prior art ROM devices showing various configurations of bitline connections for the same bitline cell programming.
Figure 2B:
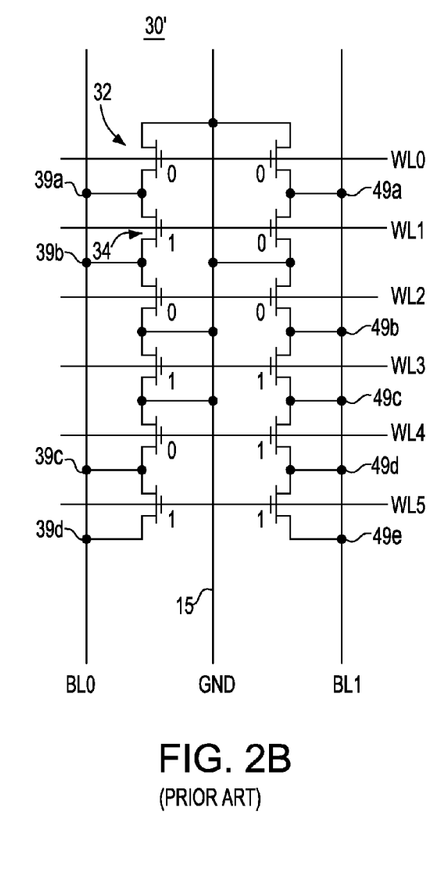

One prior art solution described in U.S. Pat. No. 5,917,224 entitled "Compact ROM Matrix" describes a ROM structure 30, shown in FIG. 2A, for improving the density of the ROM. In this prior art solution, both the drain and source connections are shared between adjacent transistors on a bitline. That is, given adjacent transistors 32, 34 connected to bitline BL0, as shown in FIGS. 2A and 2B, a cell is programmed to '0' by connecting one side (e.g., the drain) of the transistor 32 to the bitline, and the other side 40 of the transistor 32 (e.g., source) to a separate GND line 15. To program a corresponding cell to '1', both source and drain terminals are connected to a bitline, i.e., a BL/BL connection, or both source and drain terminals are connected to a GND line 15, i.e., a GND/GND connection. This allows the sharing of source and drain connections between adjacent transistors resulting in a dense ROM. For the bitline programming of the ROM structure as shown in FIG. 2A, bitline BL0 has three (3) physical bitline connections 29a, 29b and 39c and, bitline BL1 has two (2) connections 29e and 29f.

FIG. 2B shows a ROM structure 30' similar to the ROM structure 30 of FIG. 2A. However, for the same bitline programming of the ROM structure as shown in FIG. 2A, bitline BL0 has four (4) connections 39a, 39b, 39c and 39d and, bitline BL1 has five (5) connections 49a-49e.

Figure 3A:
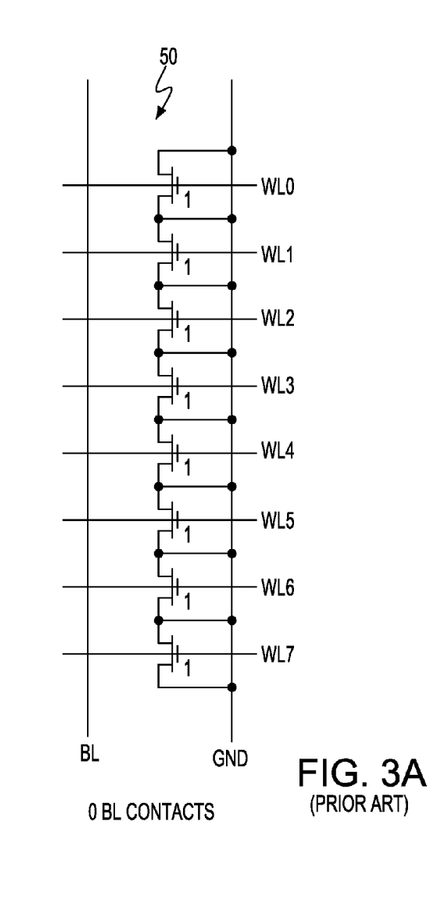
FIGS. 3A and 3B show respective embodiments of identically programmed prior art ROM devices with zero bitline connections (FIG. 3A) and nine bitline connections (FIG. 3B)
Figure 3B:
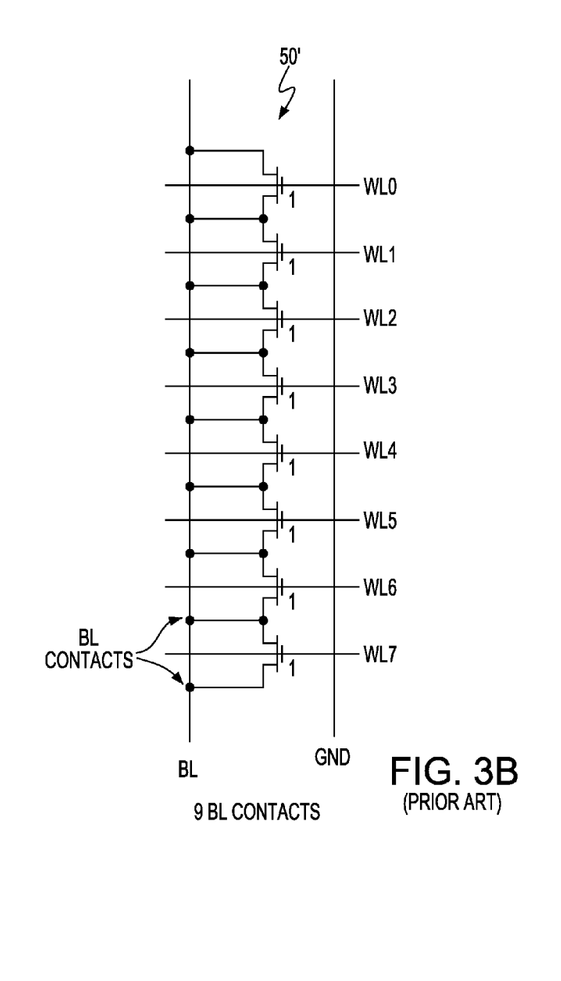

However, it is the case that the circuit structures 30 and 30' do not completely address bitline load variation. For example, as shown in FIG. 3A, when a bitline has all activation devices programmed to logic '1', the only solutions that would be possible are: 1) no bitline connections as shown as cell column 50 in FIG. 3A, or 2) both source/drain of all transistors connected to the bitline as shown as cell column 50' in FIG. 3B. Neither case is desirable.

US Patents No. 2010/0177544 and No. 2011/0249481 offer some enhancements over U.S. Pat. No. 5,917,224. These two patents propose adding a ground line for every ROM cell column to improve bitline shielding and also describe a method for improving ROM performance by changing the width of the ROM cell device when the ROM is programmed. However those patents also do not address bitline load balancing.

It would be desirable to provide a method of designing the bitline cell architecture for bitline programming that would enable optimal bitline loading for any combination of '1's and '0's on the bitline.

BRIEF SUMMARY

A dense ROM structure having open state and/or breaks in the diffusion to provide bitline balancing, and a programming method for designing the dense ROM structure.

There is provided, in a further aspect, a ROM bitline cell apparatus and programming method that exhibits improved load balancing for any combination of '1's or all '0's on the line. For example, in one embodiment, a ROM bitline cell apparatus and programming method exhibits improved load balancing when a bitline has all '1's or all '0's.

In a further aspect, there is provided a ROM bitline programming methodology such that it is perfectly or near-perfectly balanced for any combination of '1's and '0's. This method identifies groups of consecutive '1's on the bitline and instead of connecting the '1' devices between BL/BL or GND/GND, those '1' devices can be connected between BL/OPEN, OPEN/BL, GND/OPEN, OPEN/GND or OPEN/OPEN. With little or no variation in bitline loading, timing can be optimized for that single case of bitline loading. This scheme will simplify timing and improve ROM performance and power.

There is provided a Read Only Memory (ROM) structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at the wordline conductor to provide a programmed bit value to the individual bitline conductor, wherein a programmed bit value comprises a logic '1' or logic '0' level signal value, the ROM device further comprising: two or more activation cells at consecutive two or more wordline conductors, each activation cell configured to provide a logic value on the individual bitline conductor, a transistor device of the first or second activation cell configured to provide a respective logic value includes a gate connected to the first or second wordline conductor, a first transistor device terminal physically connected to the individual bitline conductor (BL) and another transistor device terminal remains open circuit (OPEN).

There is also provided a ROM structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at the wordline conductor to provide a programmed bit value to the individual bitline conductor, wherein a programmed bit value comprises a logic '1' or logic '0' level signal value, the ROM device further comprising: a ground (GND) conductor associated with one or more individual bitline conductors, two or more activation cells at consecutive two or more wordline conductors each activation cell configured to provide a logic value on the individual bitline conductor, a transistor device of the first or second activation cell configured to provide a respective logic value includes a gate connected to the first or second wordline conductor, a first transistor device terminal physically connected to the GND conductor, and another transistor device terminal remains open circuit (OPEN).

There is further provided a ROM structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at the wordline conductor to provide a programmed bit value to the individual bitline conductor, wherein a programmed bit value comprises a logic '1' or logic '0' level signal value, the ROM device further comprising: two or more activation cells at consecutive two or more wordline conductors, each activation cell configured to provide a logic value on the individual bitline conductor, a transistor device of the first or second activation cell configured to provide a respective logic value includes a gate connected to the first or second wordline conductor, a transistor device terminal physically connected to the open circuit (OPEN) and another transistor device terminal remains OPEN.

There is provided a method for designing a ROM structure having a plurality of wordline conductors, each associated with a plurality of individual bitline conductors, and a plurality of activation cells, each activation cell connecting a respective wordline conductor to an individual bitline conductor, each activation cell including a transistor device responsive to a signal at the wordline conductor to provide a programmed bit value to the individual bitline conductor, the designing method comprising: a) specifying a logical personalization for bits to be programmed in the ROM device; b) specifying, based on the logical personalization, logic level values to be programmed at each respective activation cell at a respective wordline conductor associated with the individual bitline conductor; c) assigning, based on the specified logic level values, initial connections of one or more transistor device terminals of a transistor device at each activation cell to the individual bitline conductor, or a ground (GND) conductor associated with the individual bitline based on the specified logic level values to be programmed; d) determining if a number of assigned individual bitline conductor connections to activation transistor terminals is outside a threshold range, and e) if the determined number of individual bitline conductor connections is outside a threshold range, then optimizing a number of individual bitline conductor connections to the individual bitline conductor by f) identifying presence of at least two consecutive identical logic level values to be programmed at the individual bitline conductor; and g) re-assigning transistor device terminal connections for two adjacent activation cells programmed to provide the two consecutive identical logic level values such that one or both transistor device terminal connections of each the two adjacent cell are left unconnected (OPEN); and repeating the steps c) through g) for each individual bitline conductor for improved load-balancing across all bitlines, wherein a programmed processor unit performs the logic level value specifying, the initial connection assigning, the outside threshold range determining, and the optimizing the number of individual bitline conductor connections.

BRIEF DESCRIPTION OF THE SEVERAL VIEWS OF THE DRAWINGS

The objects, features and advantages of the present invention will become apparent to one of ordinary skill in the art, in view of the following detailed description taken in combination with the attached drawings, in which.

DETAILED DESCRIPTION

FIGS. 4A-4E generally depicts example uses of transistor device open state connections to provide bitline balancing.

Open bitline connection refers to a source or drain of a transistor being neither connected to a bitline—nor connected to a ground (GND) line (i.e., it is electrically floating or left open).

That is, given a ROM design with a plurality of N wordlines with a predetermined number of bits (e.g., N=8, 16, 32, etc.) on a bitline, bitline (BL) and ground (GND) conductors are formed over each bit column. Alternatively, the ground (GND) line could be shared between adjacent bit columns. To program a respective logic level, i.e., a logic '0' or logic '1', a contact (e.g., a conductor such as a via) is formed between the transistor terminals of the transistor device and either the bitline and/or ground depending on the logic.

In a ROM design, each bit is personalized—i.e., each bit is programmed to a desired state. The objective in the present embodiments is to provide optimal bitline loading, i.e., minimal variation in capacitive loads across all bitlines. Minimal variation in bitline loading makes timing consistent across all bitlines and simplifies the ROM design.

For example, in the embodiments described herein, instead of programming a ROM cell to '1' by connecting both the source and drain to BL or GND, in this method a cell is programmed to a '1' by connecting the source/drain of the transistor to BL/OPEN, OPEN/BL, GND/OPEN, OPEN/GND or OPEN/OPEN in situations where there are two or more consecutive '1's on a bitline. FIGS. 4A-4E show different ways of programming an 8-bit bitline with all '1's using this technique.

For each of the ROM device structures (100A-100E) shown in FIGS. 4A-4E, respectively, eight wordlines WL0, . . . , WL7 are provided, each having an associated bitline memory cell embodied as an activation transistor device 101 programmed to provide a respective logic '1' level BL signal when a corresponding wordline is activated. When programming all eight bits to logic '1', only 4 physical connections to each bitline (BL) are provided for improved BL balancing. Ideally, for N wordlines, optimized bitline loading would consist of N/2 physical connections from the cells to the bitline.

Figure 4A:
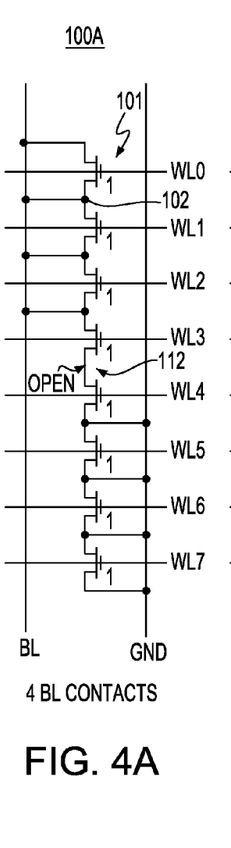
FIGS. 4A-4E generally depicts different ways of programming an 8-bit bitline with all '1's using the techniques according to one embodiment.

In FIG. 4A, for the memory cell transistors connecting wordlines WL0, WL1, and WL2, both the source and drain terminals are connected to the bitline (BL). For the transistor connected to WL3, it is shown that the source (or drain) is connected to the BL and the other drain (or source) terminal is left unconnected, i.e., an open circuit (OPEN). This OPEN 112 is shared with the transistor connecting wordline WL4 and allows the other terminal (drain or source) of that transistor to be connected to GND. Thus, in ROM device structure 100A, one transistor (at WL3) includes a BL/OPEN connection and the adjacent transistor (at WL4) includes an OPEN/GND connection. This further allows both the source and drain terminals of transistors at wordlines WL5, WL6, and WL7 to be connected to GND. The OPEN enables optimal loading (4 physical connections) for the bitline (BL) of structure 100A. With respect to the activation transistor connection at WL3, when this transistor connected between bitline and OPEN is accessed (when associated wordline turns ON), there will be some charge sharing between the OPEN node and bitline. However since the bitline has significantly more capacitance than the OPEN node, the charge sharing will have minimal impact on the bitline (due to the bitline being precharged) allowing the '1' to be detected correctly. Furthermore since there is very little variation in bitline loading with the proposed scheme, this charge-sharing situation can be easily modeled.

Figure 4B:
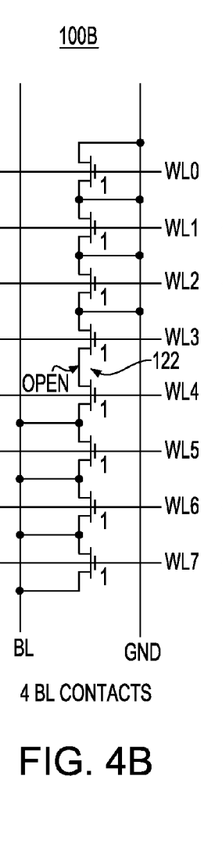

Similarly, for the example device 100B of FIG. 4B, the cell transistor at wordline WL3 features a GND/OPEN connection and the transistor at wordline WL4 features an OPEN/BL connection. This OPEN 122 enables optimal bitline loading (4 physical connections) for the BL in structure 100B.

Figure 4C:
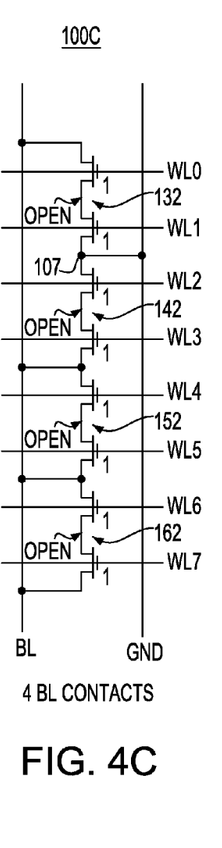
Figure 4D:
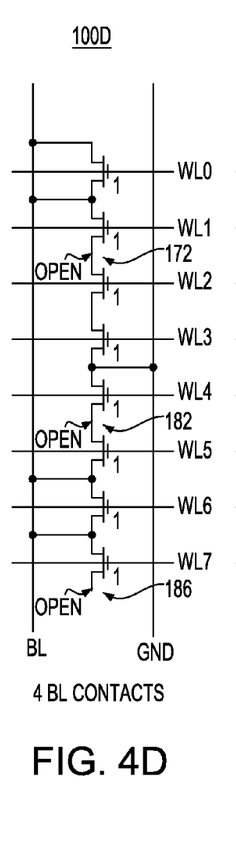

FIGS. 4C and 4D show additional permutations of GND/OPEN, OPEN/GND, BL/OPEN, OPEN/BL connections while still preserving optimal bitline loading (4 physical connections) for the respective BLs of structures 100C and 100D. In structure 100C of FIG. 4C, the GND/OPEN connections at the transistor connecting WL1 include open circuit 132 shared with transistor connecting WL1; the OPEN/GND connections at the transistor connecting WL3 include open circuit 142 shared with transistor connecting WL2, BL/OPEN connections at the transistor connecting WL4 include open circuit 152 shared with transistor connecting WL5, while the OPEN/BL connections at the transistor connecting WL7 include open circuit 162 shared with transistor connecting WL6.

In example memory device structure 100D of FIG. 4D, there is configured OPEN/GND terminal connections at transistor connecting WL2 that includes open circuit 172 shared with transistor connecting WL1. Similarly, the transistor connecting WL5 includes an OPEN/BL connections including open circuit 182 shared with transistor connecting WL4. Further, the transistor connecting WL7 is configured with BL/OPEN transistor terminal connections, the one open terminal 186 is not shared with any adjacent cell transistor.

Figure 4E:
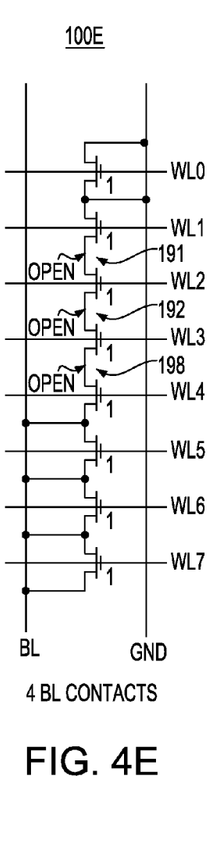
Figure 5:
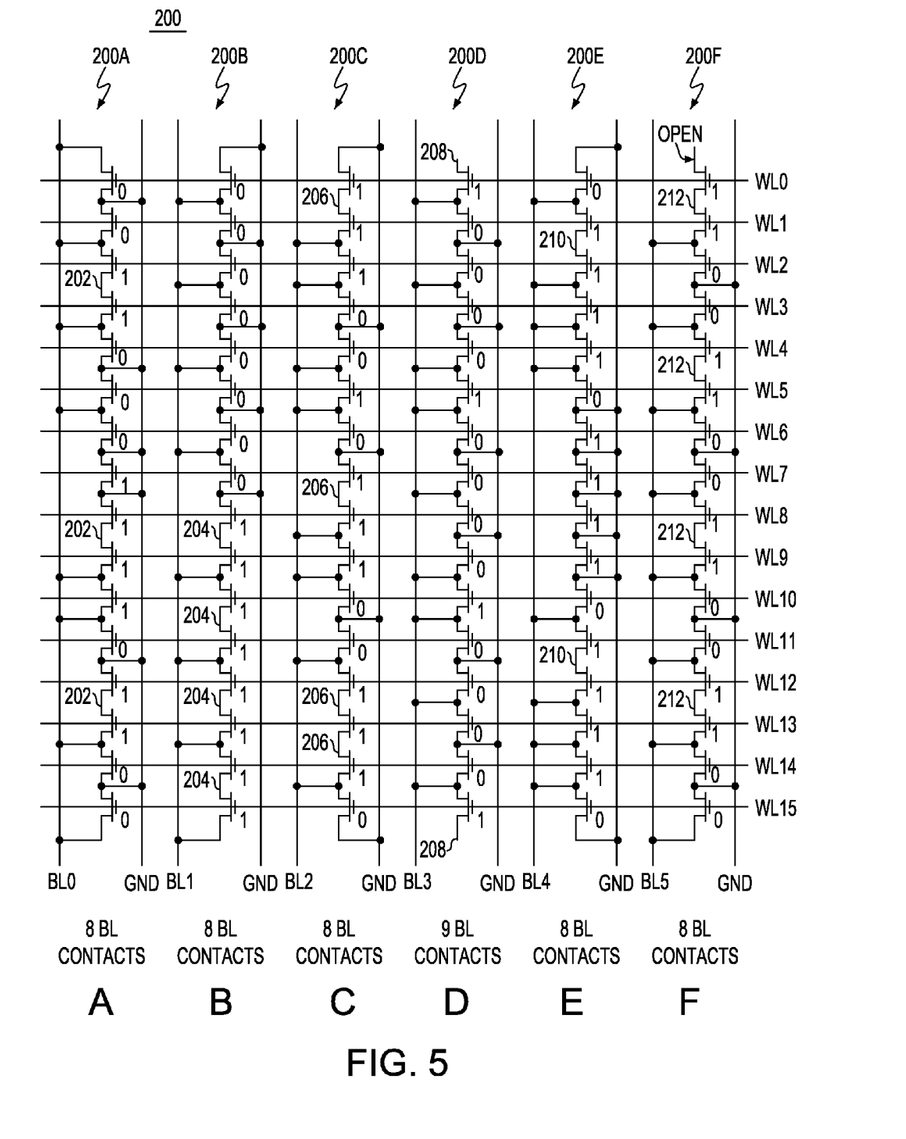
FIGS. 5A-5F each show different combinations of bitline programming (e.g., '1's and '2's) on a 16-bit bitline and the use of OPENs to achieve bitline load balancing.

Further, as shown in FIG. 4E, transistors at wordlines WL2 and WL3 have both the source and drain terminals left unconnected (OPEN) as shown at connections 191, 192 and 198 forming an OPEN/OPEN while still preserving optimal bitline loading (4 physical connections) for the BL of structure 100E.

FIGS. 5A-5F show example bitline load-balancing schemes for different combinations of bitline programming of a ROM Device 200. In particular, each scheme of FIGS. 5A-5F shows different combinations of '1's and '0's on a bitline with 16 wordlines WL0-WL15 and how the use of OPENs (202, 204, 206, 208, 210, and 212) coupled with several adjacent cells having common shared BL and/or common shared GND connections improve ROM device bitline load balancing.

In particular in FIGS. 5A, 5B, 5C, 5E, and 5F, respective bitlines labeled BL0, BL1, BL2, BL4, and BL5 are load-balanced providing 8 (N/2 where N=16) physical bitline connections. In FIG. 5D, the specific pattern of '1's and '0's doesn't allow 8 physical connections but 9 physical BL connections. The previously described OPEN structures significantly improves bitline load-balancing but some combinations of bitline programming may not result in ideal (N/2) bitline connections.

Figure 6:
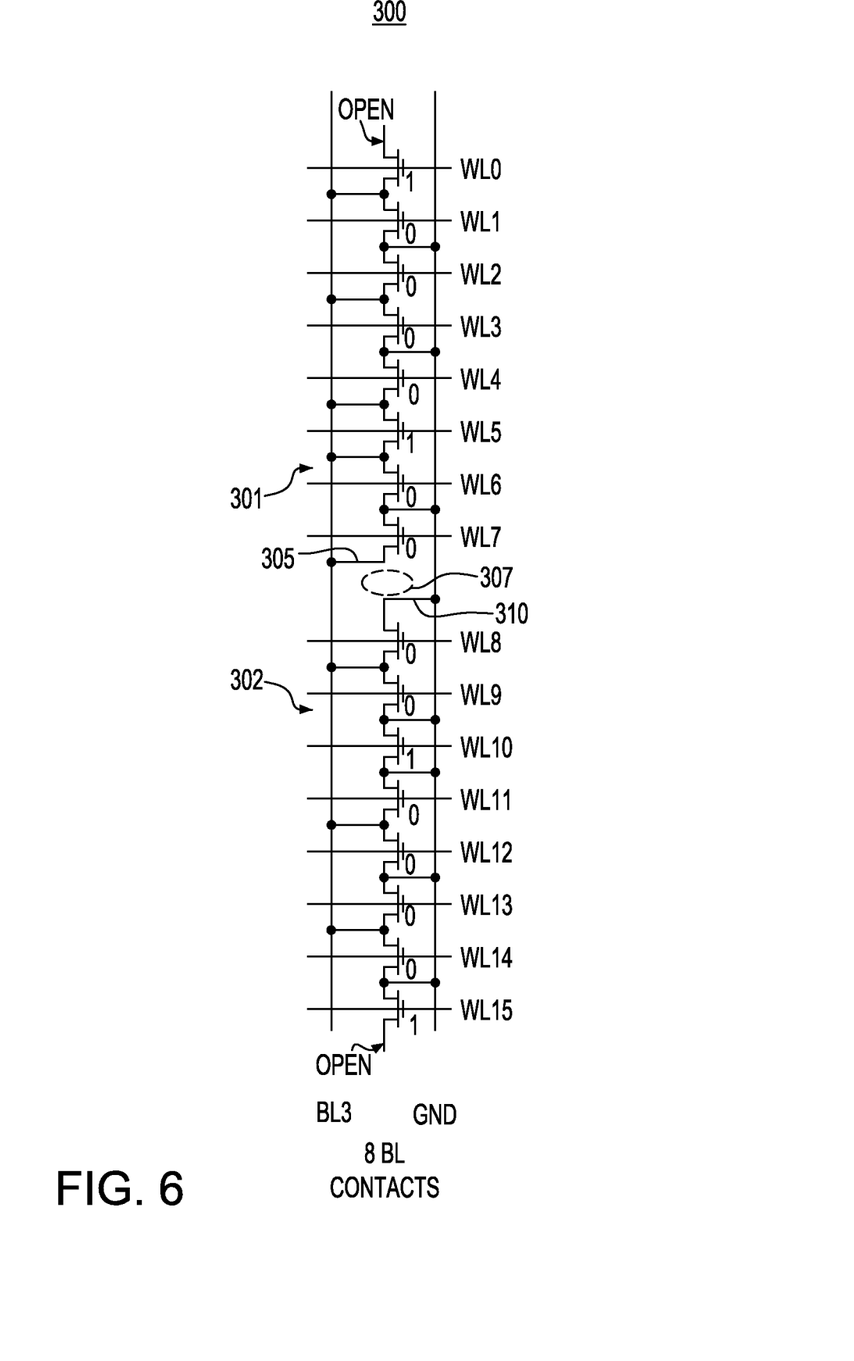
FIG. 6 shows an additional enhancement to the ROM structure in which bitline load-balancing can be improved further by adding one or more breaks in the diffusion.

In a further embodiment, adding one or more breaks (e.g., a dielectric spacer structure) in the diffusion provides additional flexibility for bitline load-balancing. For example, FIG. 6 shows an additional enhancement to the ROM structure 300 that has identical bitline programming as the structure 200D in FIG. 5D. In this example, a single diffusion block is replaced by two blocks of diffusion allowing a half 301 of the bitline to be separately programmed from the other half 302, further improving bitline load-balancing.

In FIG. 6, a single break 307 is provided in a continuous diffusion region in which terminals of transistors associated with WL7 and WL8 are formed. This break, which in one embodiment is shown as a dielectric spacer structure, effectively isolates the diffusion into two portions, and allows greater flexibility for the terminal connections of the transistor at wordline WL8. In structure 200D of FIG. 5D, the transistor at wordline WL7 has GND/BL3 terminal connections and the transistor at wordline WL8 has BL3/GND terminal connections where BL3 is the shared connection between the two transistors. With the diffusion break 307 in the structure 300 of FIG. 6, terminal 305 of transistor at WL7 is still shown to be connected to BL3 but the terminal 310 of transistor at wordline WL8 can be connected to BL3 or GND since there is no longer a shared connection between those two transistors. For example in FIG. 6, the terminal 310 of the transistor at wordline WL8 is connected to GND and the transistor is shown to have GND/BL3 terminal connections. The terminal connections for the subsequent transistors at wordlines WL9-WL15 in FIG. 6 change from the corresponding connections in FIG. 5D, based on the terminal connections of the transistor at wordline WL8. As a result, half 301 of the bitline BL3 in FIG. 6 has 5 bitline connections and the other half 302 has 3 bitline connections such that bitline BL3 has 8 connections overall. The diffusion break 307 in FIG. 6 allows the bitline BL3 to be optimally balanced with 8 connections (N/2 where N=16) as compared to the bitline BL3 of FIG. 5D that has 9 connections. Thus the spacer, or break in the diffusion (e.g., in a long column) provides greater flexibility in programming bits to logic '1' or logic '0' and eliminates a dependency that may exist to the adjacent bit programmed value.

Figure 7:
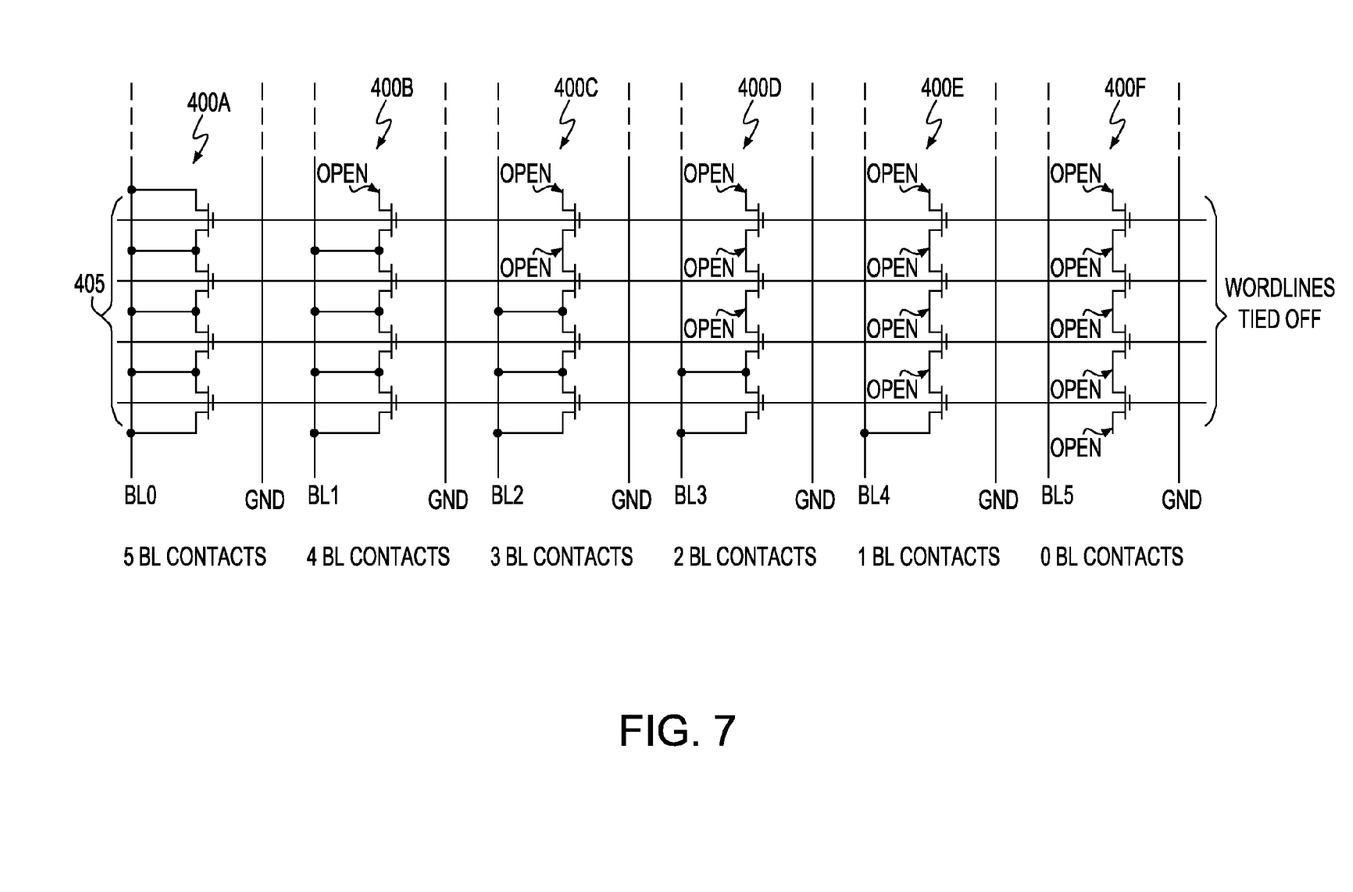
FIG. 7 shows the addition of dummy rows to one or more bitlines for achieving additional bitline load-balancing.

FIG. 7 shows another enhancement in which dummy rows are added for bitline load balancing. Load balancing could be further fine-tuned by adding extra bitline connections to the dummy rows 405 as shown in FIG. 7. Structures 400A-400F in FIG. 7 demonstrates how 5 to 0 bitline connections can be added to the bitlines BL0-BL5 respectively with the addition of 4 dummy rows. These structures provide additional flexibility to optimize bitline load balancing. It is understood that the number of dummy rows does not have to be fixed at 4. The number of dummy rows can be increased or decreased to provide more or fewer additional bitline connections respectively. In each of the embodiments, the wordlines 405 associated with the dummy rows are permanently disconnected so that they do not interfere with the charging/discharging of the bitlines. These WLs 405 are tied OFF so that the transistors at each WL are never activated. In structures 400B-400F, one or more transistor terminals, not connected to the corresponding bitline, are left unconnected or OPEN. Alternatively, these terminals could be connected to ground.

Figure 8:
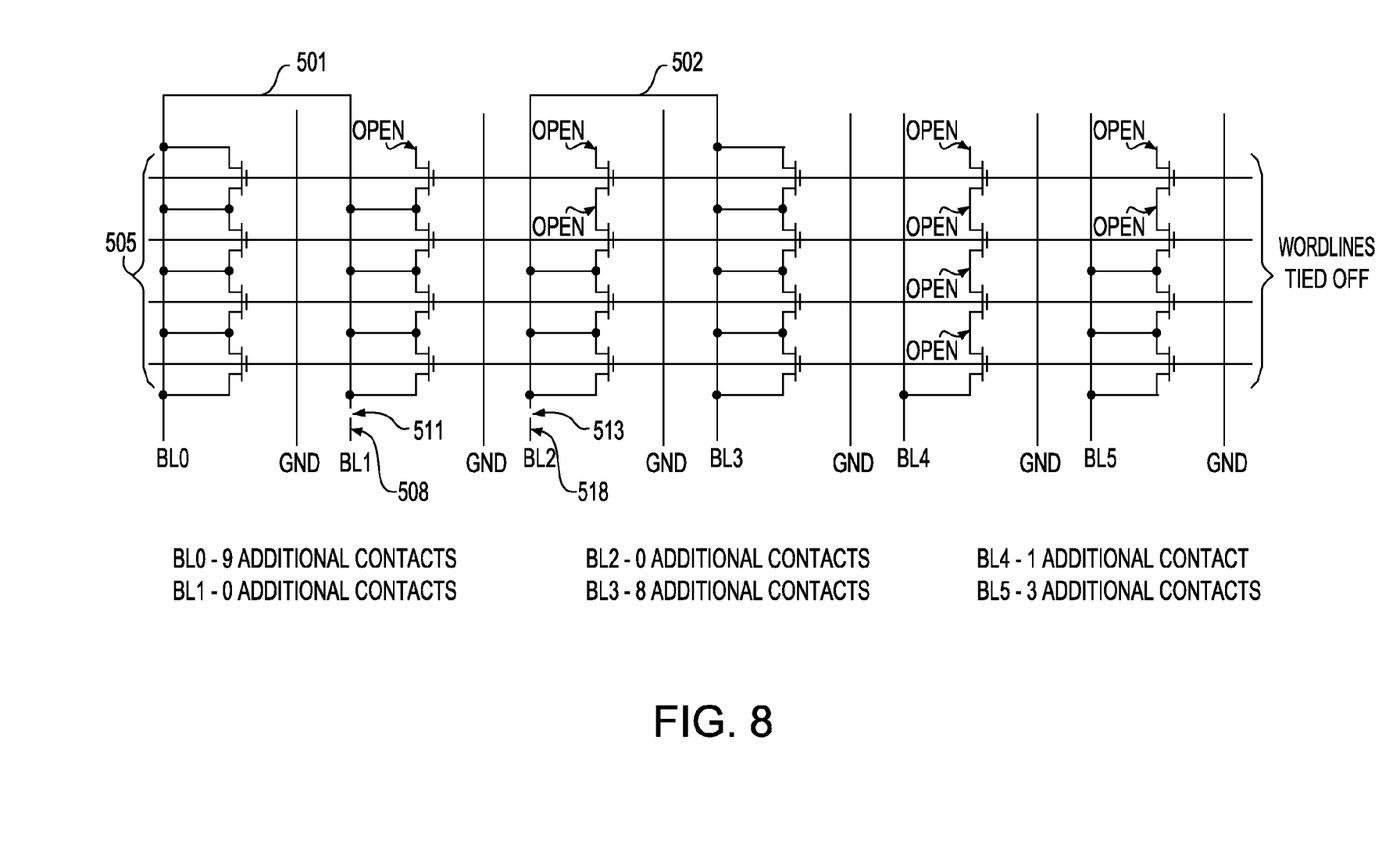
FIG. 8 shows in one embodiment, the addition of dummy rows to one or more bitlines for achieving additional bitline load-balancing in which adjacent dummy rows are connected to provide additional bitline load balancing flexibility.

FIG. 8 shows a structure for achieving additional bitline load-balancing flexibility by using dummy devices from adjacent columns. Identical to dummy wordline structure 405 in FIG. 7, wordline rows 505 in FIG. 8 represent the dummy wordline rows. Additionally in FIG. 8 conductive connections 501 and 502 are added to BL0 and BL3 respectively. The connections 501 and 502, such as vias or similar conductive structures, allow the adjacent dummy bitline columns to be used to provide additional locations where bitline connections can be made to allow further load balancing for BL0 and BL3. The dummy rows previously associated with BL1 and BL2 are disconnected at 511 and 513 and can no longer be used by BL1 and BL2 for load balancing purposes.

Figure 9:
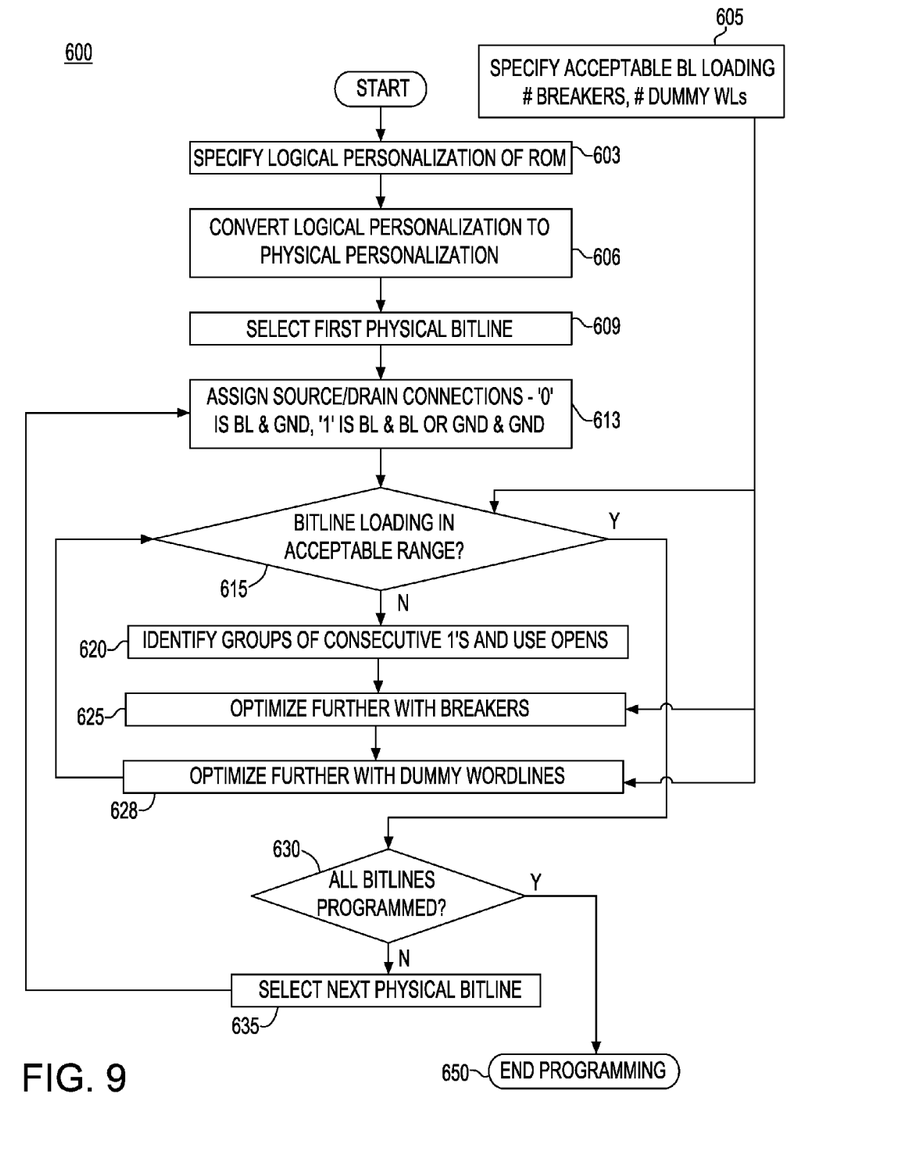
FIG. 9 shows in one embodiment, a flow-chart 600 of a ROM programming methodology for achieving optimal bitline load-balancing.

FIG. 9 shows a flow-chart of a method 600 for programming a ROM with the objective of optimal load balancing across all bitlines. First, the design method includes at 603 specifying the data to be stored in the ROM (Logical personalization) that is independent of the ROM physical architecture. At 605, the acceptable bitline loading criterion is specified as well as the number of breakers and dummy wordlines that can be used for bitline load balancing. As an example, an acceptable bitline loading criterion could be N/2+/−1, where N is the number of wordlines on each bitline. Then at 606 this logical personalization is converted to physical representation to identify the '1's and '0's on each of the physical bitlines depending on ROM architecture. The bitline programming starts at 609 selecting a $1^{st}$ physical bitline, and at 613, assigning initial connections to the source/drain connections to that selected bitline. For example, according to the structures shown herein, a cell may be programmed to a logic zero ('0') by assigning a BL/GND or GND/BL connection, and a cell may be programmed to a logic one ('1') by assigning BL/BL or GND/GND connections depending upon the initial assignment of an adjacent cell. At this point, at 615 the number of physical connection on bitline are calculated and evaluated against the acceptable bitline loading criteria (specified in 605).

If the bitline loading is not in the acceptable range, then the process continues at 620 where groups of consecutive '1's are identified for the purpose of changing the source/drain terminal connection assignments such that one or both are left OPEN (no connection). If one or more diffusion breaks can be used (specified in 605), then the opportunity to further optimize is identified in 625. As explained previously, diffusion breaks provide greater flexibility in programming bits to logic '1' or logic '0' by eliminating dependency that may exist to the adjacent bit programmed value. These diffusion breaks may already exist in the design or they could be added as needed for bitline load balancing. Then continuing at 628, if one or more dummy wordline rows can be used (specified in 605), then further optimization can be performed by adding bitline connections to these dummy rows (as in FIG. 7). Alternatively, or in addition, at 628 further optimization may be done by adding bitline connections from an adjacent dummy bitline column (as shown in FIG. 8). These dummy wordline rows may already exist in the design or they could be added as needed for bitline load balancing. Then the process proceeds to step 630 where a determination is made as to whether all bitlines have been programmed and optimally load-balanced. If at 630, it is determined that all bitlines have been programmed and optimally load-balanced, the process terminates at 650. Otherwise, the process continues at 635 in which a next physical bitline is selected for processing and the process returns to 613 where new assignments of the initial connections to the source/drain terminals to that new selected bitline are determined. Then the ROM bitline load-balancing process repeats by continuing to 615. The process steps repeat until all bitlines have achieved optimal loading.

Returning to 615, if it is determined that the bitline loading is in the acceptable range, then the process proceeds to 630 where a further decision is made as to whether all bitlines have been programmed and process continues past 630 as described previously. If, at 630, it is determined that all bitlines have not been programmed, then the process proceeds to step 635 in which a next physical bitline is selected for processing and the process returns to 613 where the source/drain connections of the new selected bitline are assigned initial connections. Then the process continues to 615 and the process repeats until all bitlines have been processed and until the bitline loading of each is within the acceptable range.

Various aspects of the present disclosure may be embodied as a program, software, or computer instructions embodied or stored in a computer or machine usable or readable medium, which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The computer readable medium could be a computer readable storage medium or a computer readable signal medium. Regarding a computer readable storage medium, it may be, for example, a magnetic, optical, electronic, electromagnetic, infrared, or semiconductor system, apparatus, or device, or any suitable combination of the foregoing; however, the computer readable storage medium is not limited to these examples. Additional particular examples of the computer readable storage medium can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an electrical connection having one or more wires, an optical fiber, an optical storage device, or any appropriate combination of the foregoing; however, the computer readable storage medium is also not limited to these examples. Any non-transitory tangible medium that can contain, or store a program for use by or in connection with an instruction execution system, apparatus, or device could be a computer readable storage medium.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, and the like.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

The invention claimed is:

1. A Read Only Memory (ROM) structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at said wordline conductor to provide a programmed bit value to said individual bitline conductor, wherein a programmed bit value comprises a logic '1' or logic '0' level signal value and the activation cells of said plurality are configured such that adjacent cells along the bitline conductor share a common semiconducting diffusion region, the ROM device further comprising:

two or more activation cells at consecutive two or more wordline conductors, each activation cell configured to provide a logic value on said individual bitline conductor, a transistor device of said first or second activation cell configured to provide a respective logic value includes a gate connected to said first or second wordline conductor, a first transistor device terminal physically connected to the individual bitline conductor (BL) and another transistor device terminal remains open circuit (OPEN).

2. The ROM structure as claimed in claim 1, including N wordline conductors, wherein N is a whole number, each conductor of said N wordline conductors having an associated programmed activation cell including a transistor device corresponding to said individual bitline conductor, wherein N/2 transistor device terminals of said activation cells corresponding to the individual bitline conductor physically connect to the individual bitline conductor.

3. The ROM structure as claimed in claim 1, wherein said transistor device terminals of said two or more activation cells that physically connect to the individual bitline conductor are not consecutive.

4. The ROM structure as claimed in claim 1, wherein a terminal of a transistor device of an activation cell corresponding to a wordline shares a diffusion region with a terminal of a transistor device of an activation cell of an adjacent wordline, said shared diffusion region connecting terminals of said adjacent transistor devices further connects to one of: said BL, a ground conductor (GND) associated with one or more individual bitline conductors, or said open circuit (OPEN).

5. The ROM structure as claimed in claim 4, further comprising: a physical break in said diffusion region to isolate terminals of said transistor devices of said adjacent activation cells.

6. The ROM structure as claimed in claim 1, further comprising:

one or more dummy wordline conductors, each dummy wordline conductor having an activation cell associated with said individual bitline conductor, each activation cell including a transistor device in an OFF state, said transistor device having none, one or more terminals connecting to said individual bitline conductor, wherein said activation cells of said one or more dummy wordline conductors provide additional load-balancing to said individual bitline conductor.

7. The ROM structure as claimed in claim 6, further comprising:

one or more additional individual bitline conductors connecting said one or more dummy wordline conductors;

an activation cell at each dummy wordline conductor corresponding to each respective said additional individual bitline conductor, each activation cell including a transistor device in an OFF state, said transistor device having none, one or more terminals connecting to an additional individual bitline conductor; and a conductor bridging said individual bitline conductor to one or more additional individual bitline conductors, wherein said activation cells of said one or more dummy wordline conductors having transistor device terminals connecting an additional individual bitline conductor provide additional load-balancing to said individual bitline conductor.

8. The ROM structure as claimed in claim 1, wherein said individual bitline is pre-charged to one of a logic '1' value by connecting said individual bitline to a voltage power supply source, or is pre-discharged to a logic '0' value by connecting said individual bitline to GND.

9. A Read Only Memory (ROM) structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at said wordline conductor to provide a programmed bit value to said individual bitline conductor, wherein a programmed bit value comprises a logic '1' or logic '0' level signal value, and the activation cells of said plurality are configured such that adjacent cells along the bitline conductor share a common semiconducting diffusion region, the ROM device further comprising:
- a ground (GND) conductor associated with one or more individual bitline conductors,
- two or more activation cells at consecutive two or more wordline conductors each activation cell configured to provide a logic value on said individual bitline conductor, a transistor device of said first or second activation cell configured to provide a respective logic value includes a gate connected to said first or second wordline conductor, a first transistor device terminal physically connected to the GND conductor, and another transistor device terminal remains open circuit (OPEN).

10. The ROM structure as claimed in claim 9, including N wordline conductors, wherein N is a whole number, each conductor of said N wordline conductors having an associated programmed activation cell including a transistor device corresponding to said individual bitline conductor, wherein N/2 transistor device terminals of transistor devices at said activation cells corresponding to the individual bitline conductor physically connect to the individual bitline conductor.

11. The ROM structure as claimed in claim 9, wherein said transistor device terminals that physically connect to the individual bitline conductor are not consecutive.

12. The ROM structure as claimed in claim 9, wherein a terminal of a transistor device of an activation cell corresponding to a wordline shares a diffusion region with a terminal of a transistor device of an activation cell of an adjacent wordline, said shared diffusion region connecting terminals of said adjacent transistor devices further connects to one of: said BL, said ground conductor (GND), or remain open circuit (OPEN).

13. The ROM structure as claimed in claim 12, further comprising: a physical break in said diffusion region to isolate terminals of said transistor devices of said adjacent activation cells.

14. The ROM structure as claimed in claim 9, further comprising:
- one or more dummy wordline conductors, each dummy wordline conductor having an activation cell associated with said individual bitline conductor, each activation cell including a transistor device in an OFF state, said transistor device having none, one or more terminals connecting to said individual bitline conductor,
- wherein said activation cells of said one or more dummy wordline conductors provide additional load-balancing to said individual bitline conductor.

15. The ROM structure as claimed in claim 14, further comprising:
- one or more additional individual bitline conductors connecting said one or more dummy wordline conductors;
- an activation cell at each dummy wordline conductor corresponding to each respective said additional individual bitline conductor, each activation cell including a transistor device in an OFF state, said transistor device having none, one or more terminals connecting to an additional individual bitline conductor; and
- a conductor bridging said individual bitline conductor to one of said one or more additional individual bitline conductors,
- wherein said activation cells of said one or more dummy wordline conductors having transistor device terminals connecting an additional individual bitline conductor provide additional load-balancing to said individual bitline conductor.

16. A Read Only Memory (ROM) structure having a plurality of wordline conductors, each associated with a plurality of individual bitline conductors, and a plurality of activation cells, an activation cell connecting a respective wordline conductor to an individual bitline conductor, each activation cell including a transistor device responsive to a signal at said wordline conductor to provide a programmed bit value to said individual bitline conductor, wherein a programmed bit value comprises a logic '1' or logic '0' level signal value and the activation cells of said plurality are configured such that adjacent cells along the bitline conductor share a common semiconducting diffusion region, the ROM device further comprising:
- two or more activation cells at consecutive two or more wordline conductors, each activation cell configured to provide a logic value on said individual bitline conductor, a transistor device of said first or second activation cell configured to provide a respective logic value includes a gate connected to said first or second wordline conductor, a transistor device terminal physically connected to the open circuit (OPEN) and another transistor device terminal remains OPEN.

17. The ROM structure as claimed in claim 16, including N wordline conductors, wherein N is a whole number, each conductor of said N wordline conductors having an associated programmed activation cell including a transistor device corresponding to said individual bitline conductor, wherein N/2 transistor device terminals of transistor devices at said activation cells corresponding to the individual bitline conductor physically connect to the individual bitline conductor.

18. The ROM structure as claimed in claim 16, wherein said transistor device terminals that physically connect to the individual bitline conductor are not consecutive.

19. The ROM structure as claimed in claim 16, wherein a terminal of a transistor device of an activation cell corresponding to a wordline shares a diffusion region with a terminal of a transistor device of an activation cell of an adjacent wordline, said shared diffusion region connecting terminals of said adjacent transistor devices further connects to one of: said BL, a ground conductor (GND) associated with one or more bitlines, or remain unconnected (OPEN).

20. The ROM structure as claimed in claim 19, further comprising: a physical break in said diffusion region to isolate terminals of said transistor devices of said adjacent activation cells.

21. The ROM structure as claimed in claim 16, further comprising:
- one or more dummy wordline conductors, each dummy wordline conductor having an activation cell associated with said individual bitline conductor, each activation cell including a transistor device in an OFF state, said transistor device having none, one or more terminals connecting to said individual bitline conductor,
- wherein said activation cells of said one or more dummy wordline conductors provide additional load-balancing to said individual bitline conductor.

22. The ROM structure as claimed in claim 21, further comprising:
- one or more additional individual bitline conductors connecting said one or more dummy wordline conductors;
- an activation cell at each dummy wordline conductor corresponding to each respective said additional individual bitline conductor, each activation cell including a transistor device in an OFF state, said transistor device having none, one or more terminals connecting to an additional individual bitline conductor; and
- a conductor bridging said individual bitline conductor to one of said one or more additional individual bitline conductors,
- wherein said activation cells of said one or more dummy wordline conductors having transistor device terminals connecting an additional individual bitline conductor provide additional load-balancing to said individual bitline conductor.

23. A method for designing a Read Only Memory (ROM) structure having a plurality of wordline conductors, each associated with a plurality of individual bitline conductors, and a plurality of activation cells, each activation cell connecting a respective wordline conductor to an individual bitline conductor, each activation cell including a transistor device responsive to a signal at said wordline conductor to provide a programmed bit value to said individual bitline conductor and the activation cells of said plurality are configured such that adjacent cells along the bitline conductor share a common semiconducting diffusion region, the designing method comprising:
- a) specifying a logical personalization for bits to be programmed in the ROM device;
- b) specifying, based on said logical personalization, logic level values to be programmed at each respective activation cell at a respective wordline conductor associated with said individual bitline conductor;
- c) assigning, based on said specified logic level values, initial connections of one or more transistor device terminals of a transistor device at each activation cell to said individual bitline conductor, or a ground (GND) conductor associated with said individual bitline based on said specified logic level values to be programmed;
- d) determining if a number of assigned individual bitline conductor connections to activation transistor terminals is outside a threshold range, and
- e) if said determined number of individual bitline conductor connections is outside a threshold range, then optimizing a number of individual bitline conductor connections to said individual bitline conductor by
- f) identifying presence of at least two consecutive identical logic level values to be programmed at said individual bitline conductor; and
- g) re-assigning transistor device terminal connections for two adjacent activation cells programmed to provide said two consecutive identical logic level values such that one or both transistor device terminal connections of each said two adjacent cell are left unconnected (OPEN); and
- repeating said steps c) through g) for each individual bitline conductor for improved load-balancing across all bitlines,
- wherein a programmed processor unit performs said logic level value specifying, said initial connection assigning, said outside threshold range determining, and said optimizing said number of individual bitline conductor connections.

24. The method as claimed in claim 23, wherein said optimizing a number of individual bitline conductor connections further comprises:
- specifying, by said programmed processor unit, a spacer element to be formed to provide a break in a common diffusion connecting transistor device terminals of said two adjacent activation cells, said break isolating said transistors for improved load-balancing.

25. The method as claimed in claim 23, further comprising:
- providing one or more dummy wordline conductors that connect to individual bitline conductors, wherein said optimizing a number of individual bitline conductor connections further comprises:
- specifying, by said programmed processor unit, a connection of one or more individual bitline conductors to one or more dummy wordline conductors via a respective activation cell at the dummy wordline conductor for improved load-balancing, each respective activation cell associated with said individual bitline conductor and said dummy wordline conductor including a transistor device in an OFF state, said transistor device having none or more terminals connecting to said individual bitline conductor.

26. The method as claimed in claim 23,
- providing one or more dummy wordline conductors that connect to individual bitline conductors,
- providing one or more additional individual bitline conductors connecting said one or more dummy wordline conductors via a respective activation cell, an additional individual bitline conductor associated with a corresponding adjacent individual bitline conductor, each activation cell including a transistor device in an OFF state, said transistor device having none or more terminals connecting to an additional individual bitline conductor; wherein said optimizing a number of individual bitline conductor connections further comprises:
- bridging, using a conductor, an individual bitline conductor to one or more adjacent said additional individual bitline conductors,
- wherein said activation cells of said one or more dummy wordline conductors having transistor device terminals connecting an additional individual bitline conductor provide additional load-balancing to said individual bitline conductor.

* * * * *